(12) United States Patent
Duca

(10) Patent No.: US 12,494,419 B2
(45) Date of Patent: Dec. 9, 2025

(54) INTEGRATED CIRCUIT PACKAGE WITH WARPAGE CONTROL USING CAVITY FORMED IN LAMINATED SUBSTRATE BELOW THE INTEGRATED CIRCUIT DIE

(71) Applicant: STMicroelectronics (Malta) Ltd., Kirkop (MT)

(72) Inventor: Roseanne Duca, Ghaxaq (MT)

(73) Assignee: STMicroelectronics (Malta) Ltd., Kirkop (MT)

( * ) Notice: Subject to any disclaimer, the term of this patent is extended or adjusted under 35 U.S.C. 154(b) by 646 days.

(21) Appl. No.: 17/870,235

(22) Filed: Jul. 21, 2022

(65) Prior Publication Data
US 2023/0046645 A1   Feb. 16, 2023

Related U.S. Application Data

(60) Provisional application No. 63/231,859, filed on Aug. 11, 2021.

(51) Int. Cl.
*H01L 23/498* (2006.01)
*B81B 7/00* (2006.01)
*H01L 23/00* (2006.01)

(52) U.S. Cl.
CPC ...... *H01L 23/49822* (2013.01); *B81B 7/0048* (2013.01); *H01L 24/32* (2013.01);
(Continued)

(58) Field of Classification Search
CPC ... H01L 23/49822; H01L 24/32; H01L 24/48; H01L 24/73; H01L 2924/3511;
(Continued)

(56) References Cited

U.S. PATENT DOCUMENTS 8,900,931 B2   12/2014   Liang
9,633,953 B2   4/2017   Hsu et al.
(Continued)

FOREIGN PATENT DOCUMENTS

CN   108074824 A   5/2018

OTHER PUBLICATIONS

Garrou, Dr. Phil: "Controlling Warpage in Advanced Packaging," Semiconductor Digest, https://sst.semiconductor-digest.com/2014/09/controlling-warpage-in-advanced-packaging/, 2 pages, Sep. 2014.
(Continued)

*Primary Examiner* — Jasmine J Clark
(74) *Attorney, Agent, or Firm* — Crowe & Dunlevy LLC

(57) ABSTRACT

A support substrate includes an insulating core layer, an electrically conductive layer over the insulating core layer and a solder mask layer over the electrically conductive layer. A back side of an integrated circuit chip is mounted to an upper surface of the support substrate at a die attach location. The upper surface of the support substrate includes a cavity located within the die attach location, where the cavity extends under the back side of the integrated circuit chip. The cavity is defined by an area where the solder mask layer and at least a portion of the electrically conductive layer have been removed. Bonding wires connect connection pads on a front side of the integrated circuit chip to connection pad on the upper surface of the support substrate.

24 Claims, 4 Drawing Sheets

(52) U.S. Cl.
CPC .......... *B81B 2201/0235* (2013.01); *B81B 2201/0242* (2013.01); *B81B 2201/0264* (2013.01); *B81B 2207/098* (2013.01); *H01L 24/48* (2013.01); *H01L 24/73* (2013.01); *H01L 2224/32013* (2013.01); *H01L 2224/32225* (2013.01); *H01L 2224/48108* (2013.01); *H01L 2224/48227* (2013.01); *H01L 2224/73265* (2013.01); *H01L 2924/1461* (2013.01); *H01L 2924/1515* (2013.01); *H01L 2924/1517* (2013.01); *H01L 2924/3511* (2013.01)

(58) Field of Classification Search
CPC ..... H01L 2924/1461; H01L 2924/1517; H01L 2924/1515; H01L 2224/32225; H01L 2224/32013; H01L 2224/48227; H01L 2224/73265; B81B 7/0048; B81B 2207/098; B81B 2201/0264; B81B 2201/0235; B81B 2201/0242
See application file for complete search history.

(56) References Cited

U.S. PATENT DOCUMENTS

| | | |
|---|---|---|
| 9,640,492 B1 | 5/2017 | Arvin et al. |
| 10,566,275 B2 | 2/2020 | Arvin et al. |
| 10,586,716 B2 | 3/2020 | Lu et al. |
| 10,832,999 B2 | 11/2020 | Huang et al. |
| 11,823,995 B2 * | 11/2023 | Choi ................ H01L 23/49816 |
| 2006/0091523 A1 | 5/2006 | Shimanuki |
| 2010/0139962 A1 | 6/2010 | Kaneko |
| 2011/0074037 A1 | 3/2011 | Takeshima et al. |
| 2012/0061850 A1 | 3/2012 | Kuroda et al. |
| 2013/0001760 A1 | 1/2013 | Ho et al. |
| 2017/0179042 A1 | 6/2017 | Arvin et al. |
| 2021/0098320 A1 | 4/2021 | Garcia et al. |
| 2021/0118790 A1 | 4/2021 | Choi |

OTHER PUBLICATIONS

EPO Search Report and Written Opinion for counterpart EP Appl. No. 22188832.4, report dated Jan. 11, 2023, 9 pgs.

* cited by examiner

INTEGRATED CIRCUIT PACKAGE WITH WARPAGE CONTROL USING CAVITY FORMED IN LAMINATED SUBSTRATE BELOW THE INTEGRATED CIRCUIT DIE

CROSS REFERENCE TO RELATED APPLICATIONS

This application claims priority from United States Provisional Application for Patent No. 63/231,859, filed Aug. 11, 2021, the disclosure of which is incorporated by reference.

TECHNICAL FIELD

Embodiments herein relate to an integrated circuit package and, in particular, to controlling warpage of a laminated substrate for the integrated circuit package to which an integrated circuit die is mounted.

BACKGROUND

FIG. 1 shows a cross-section of a part of an integrated circuit package 10. The package 10 includes a laminated substrate 12. The laminated substrate 12 is formed from the lamination of a plurality of layers including an insulating (for example, FR4—fire retardant 4) core layer 14, an electrically conductive (copper) layer 18a, 18b on each of the opposed surfaces of the core layer 14, a prepreg layer 16a, 16b on each of the copper layers 18a, 18b, an electrically conductive (copper) layer 18c, 18d on each of the prepreg layers 16a, 16b and a solder mask layer 20a, 20b on each of the copper layers 18c, 18d. The laminated substrate 12 may also include plated vias (not explicitly shown) which electrically connect a portion of the copper layers 18a, 18c to a portion of the copper layers 18b, 18d. The laminated substrate 12 may take the form of a printed circuit board (PCB).

An integrated circuit die 30 is mounted to an upper surface of the laminated substrate 12. The integrated circuit die 30 includes a back side 32 and a front side 34. A plurality of integrated circuit electrical connection pads 36 are provided on the front side 34. The back side 32 of the integrated circuit die 30 is attached to the solder mask layer 20a at the upper surface of the laminated substrate 12 using an adhesive material 38 (such as a die attach glue or tape).

Openings 40 are selectively made in the solder mask layer 20a to expose corresponding portions of the copper layer 18c which provide connection pads 42 of the laminated substrate 12. Bonding wires 43 electrically connect between electrical connection pads 36 to corresponding connection pads 42.

Openings 44 are selectively made in the solder mask layer 20b to expose corresponding portions of the copper layer 18d which provide connection pads 46 of the laminated substrate 12. A solder ball 48 is mounted to connection pad 46.

A cap (or lid) 50 is attached to the laminated substrate 12 to enclose the integrated circuit die 30. Alternatively, an encapsulating body may be overmolded on the laminated substrate 12 to enclose the integrated circuit die 30.

There is a known mismatch in coefficient of thermal expansion (CTE) between the silicon material of the integrated circuit die 30 and the laminated substrate 12. For example, the CTE of silicon is approximately 2.8 ppm/° C. and the CTE of a plastic substrate is approximately 15 ppm/° C. Such a mismatch in CTE can lead to a risk of device warpage which produces a number of concerns such as: difficulty with attaching the cap 50; damage to the silicon material of the integrated circuit die 30 or the adhesive material 38; and modification of operation of the electronic circuits of integrated circuit die 30 (for example, drift in operating parameters).

There is a need in the art address the issue of device warpage.

SUMMARY

In an embodiment, an integrated circuit package comprises: a support substrate formed by an insulating core layer, an electrically conductive layer over the insulating core layer and a solder mask layer over the electrically conductive layer, wherein the support substrate includes a die attach location and first connection pads; an integrated circuit chip having a front side with second connection pads and a back side, wherein the back side is mounted to an upper surface of the support substrate at the die attach location; wherein the upper surface of the support substrate includes a cavity located within the die attach location, said cavity extending under the back side of the integrated circuit chip, said cavity comprising by an area where the solder mask layer and at least a portion of the electrically conductive layer are not present; and bonding wires between the first and second connection pads.

In an embodiment, a support substrate for an integrated circuit package comprises: an insulating core layer; an electrically conductive layer over the insulating core layer; a solder mask layer over the electrically conductive layer; and at a die attach location for said support substrate, a cavity in the upper surface of the support substrate comprising by an area where the solder mask layer and at least a portion of the electrically conductive layer are not present.

BRIEF DESCRIPTION OF THE DRAWINGS

For a better understanding of the embodiments, reference will now be made by way of example only to the accompanying figures in which.

DETAILED DESCRIPTION

It will be noted that the drawings are not necessarily presented to scale, and some exaggeration of sizes, shapes, thicknesses, etc., has been made in order ease understanding of the illustrated structures.

Figure 1:
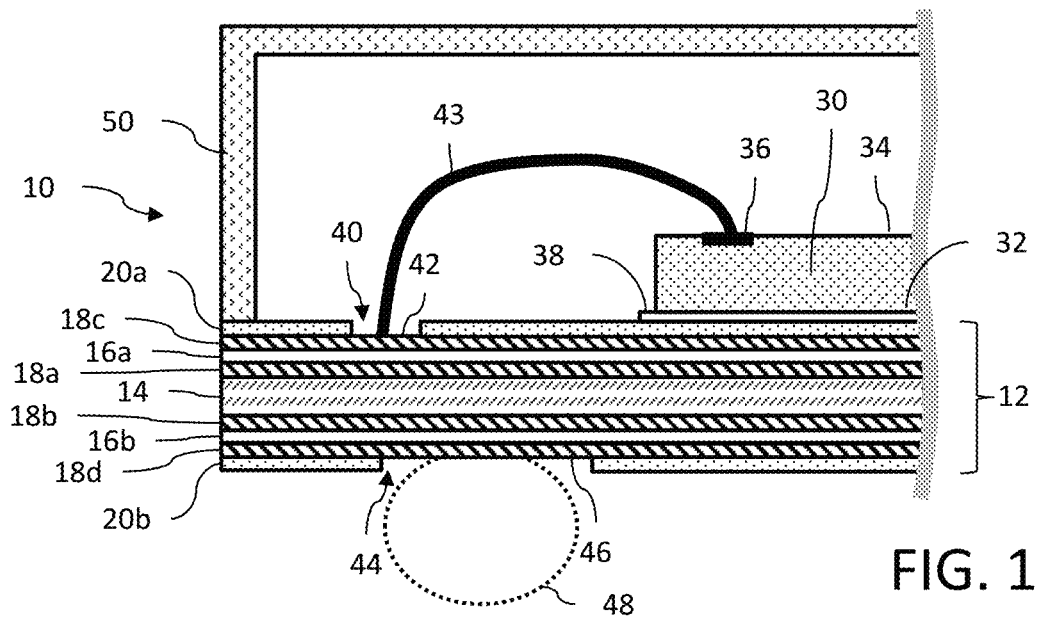
FIG. 1 is a cross-section of a part of an integrated circuit package.
Figure 2:
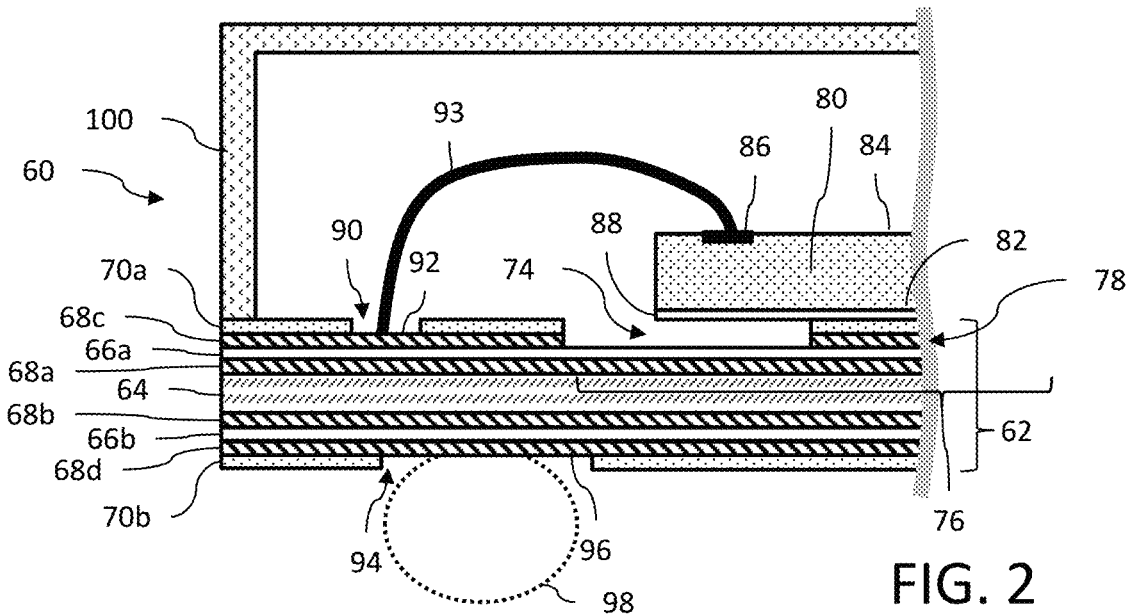
FIG. 2 is a cross-section of a part of an integrated circuit package.

FIG. 2 shows a cross-section of a part of an integrated circuit package 60. The package 60 includes a laminated (support) substrate 62. The laminated substrate 62 is formed from the lamination of a plurality of layers including an insulating (for example, FR4—fire retardant 4) core layer 64, an electrically conductive (copper) layer 68a, 68b on each of the opposed surfaces of the core layer 64, a prepreg layer 66a, 66b on each of the copper layers 68a, 68b, an electrically conductive (copper) layer 68c, 68d on each of the prepreg layers 66a, 66b and a solder mask layer 70a, 70b on each of the copper layers 68c, 68d. The laminated substrate 62 may also include plated vias (not explicitly shown) which electrically connect a portion of the copper layers 68a, 68b to a portion of the copper layers 68c, 68d. The laminated substrate 62 may take the form of a printed circuit board (PCB).

The illustration here is of a four layer copper type substrate, but this is by example only and the embodiments herein are equally applicable to substrates of other types including a two layer copper type substrate which omits the copper layers 68a, 68b and the prepreg layers 66a, 66b with the copper layers 68c, 68d on each of the opposed surfaces of the core layer 64.

The upper surface of the laminated substrate 62 is further processed to selectively remove (for example, using an etch) portions of the solder mask layer 70a and copper layer 68c to form a cavity 74 at the die attach location 76 for an integrated circuit die. The cavity 74 may, for example, be formed in a peripheral area of the die attach location 76. In the illustrated example, the cavity 74 reaches the prepreg layer 66a of the four layer copper substrate; but, in the case of a two layer copper substrate the cavity would instead reach the core 64.

An integrated circuit die 80 is mounted to an upper surface of the laminated substrate 62 at the die attach location 76. The integrated circuit die 80 includes a back side 82 and a front side 84. A plurality of integrated circuit electrical connection pads 86 are provided on the front side 84. The back side 82 of the integrated circuit die 80 is attached to the solder mask layer 70a at the upper surface of the laminated substrate 62 using an adhesive material 88 (such as a die attach glue or tape). It will be noted that because of the presence of the cavity 74, the peripheral part of integrated circuit die 80 will cantilever hang over the cavity. Thus, there are portions of the back side 82 of the integrated circuit die 80 at the location of the cavity 74 which are decoupled from the laminated substrate 62 with a corresponding reduction in CTE mismatch and risk of warpage or deformation.

In an embodiment, the integrated circuit die 80 is a micro-electrical-mechanical system (MEMS) device. The MEMS device may be a cavity type device such as with a pressure sensor, a gyroscope or an accelerometer.

Openings 90 are selectively made in the solder mask layer 70a to expose corresponding portions of the copper layer 68c which provide connection pads 92 of the laminated substrate 62. Bonding wires 93 electrically connect electrical connection pads 86 to corresponding connection pads 92.

Openings 94 are selectively made in the solder mask layer 70b to expose corresponding portions of the copper layer 68d which provide connection pads 96 of the laminated substrate 62. A solder ball 98 is mounted to the connection pad 96. The connection pads 96 may be arranged to form a ball grid array type layout.

A cap (or lid) 100 is attached to the laminated substrate 62 to enclose the integrated circuit die 80. Alternatively, an encapsulating body may be overmolded on the laminated substrate 62 to enclose the integrated circuit die 80.

Figure 3A:
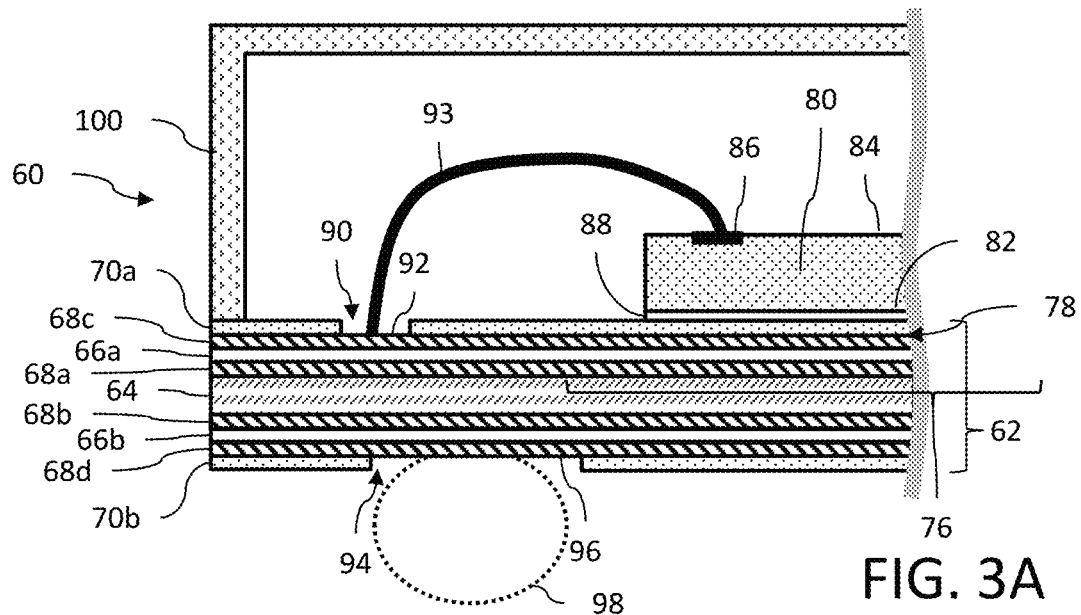
FIG. 3A-3B are cross-sections of an alternative embodiment.
Figure 3B:
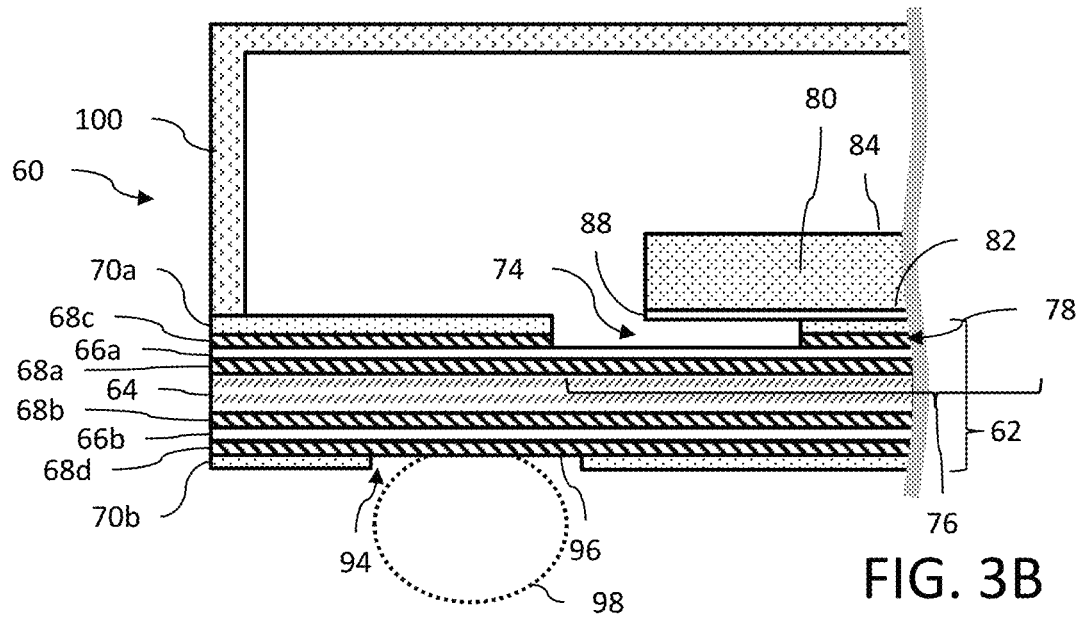

FIGS. 3A-3B show an alternative embodiment. Like references in FIGS. 2 and 3 refer to like or similar components. It is noted that provision of the cavity 74 underneath portions of the back side 82 of the integrated circuit die 80 that are vertically aligned with locations of electrical connection pads 86 (as shown in FIG. 2) could present a breakage concern during the process for installation of the bonding wire. FIG. 3A shows that the cavity 74 is omitted at those locations. FIG. 3B shows that the cavity 74 is provided at locations where there is no corresponding vertically aligned electrical connection pad 86.

The embodiments of FIGS. 2 and 3A-3B show a complete removal of the copper layer 68c in the cavity 74. It will be understood, however, that this is by way of example only and that in some implementations the thickness of the copper layer 68c in the cavity 74 is simply reduced (see, FIG. 4D). In this regard, reduction in thickness of the copper layer 68c at the location of the cavity 74 still serves to advantageously decouple portions of the back side 82 of the integrated circuit die 80 from the laminated substrate 62.

Care must be taken during attachment of the integrated circuit die 80 to the laminated substrate 62 such that the die attach force is not applied at the locations where the cavity 74 is present. The die attach force should be restricted for application only at the portions of the die attach location 76 where the copper layer 68c and solder mask layer 70a remain in place.

Figure 4A:
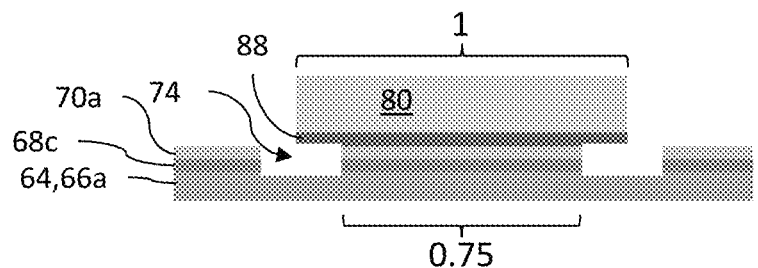
FIGS. 4A-4D are simplified cross-sectional views showing a variety of arrangements for the provision of the cavity.
Figure 4B:
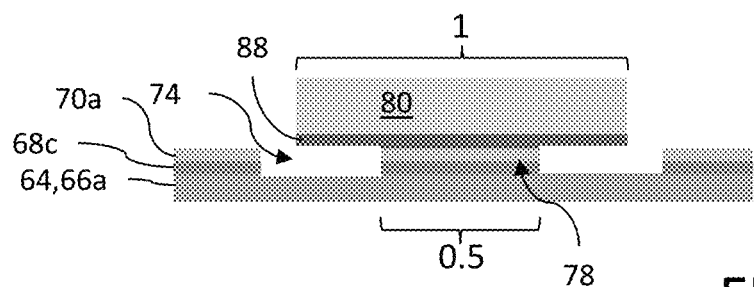
Figure 4C:
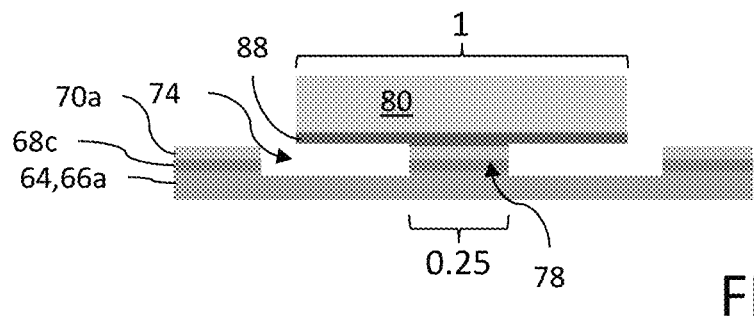
Figure 4D:
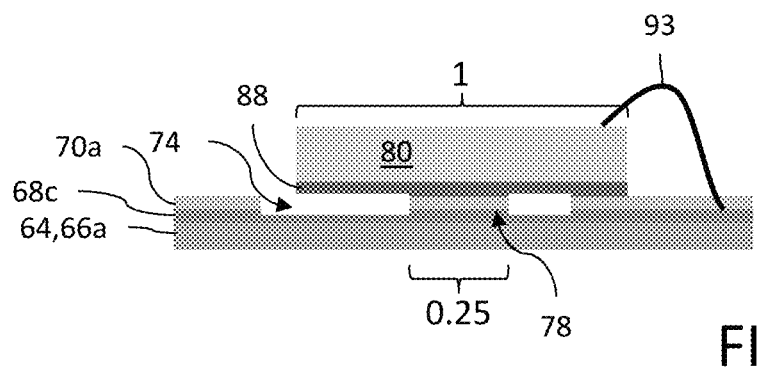

FIGS. 4A-4D are simplified cross-sectional views showing a variety of arrangements for the provision of the cavity 74. FIGS. 4A-4C show that the ratio of the area of the cavity 74 to the area of the back side 82 of the integrated circuit die 80 attached to the die attach location 76 where the copper layer 68c and solder mask layer 70a remain in place can vary from 1:3 to 1:1 to 3:1. FIG. 4D shows that the cavity 74 is not present at locations where there is a corresponding bonding wire connection, while being present at other locations where there is no attachment of the bonding wire. FIG. 4D further shows an implementation in which the formation of the cavity does not cause removal of the entire thickness of the copper layer 68a, but rather partially thins this copper layer 68c. The amount of thinning (i.e., recessing or removal) of the copper layer 68c is dependent on the etch parameters for forming the cavity. In each of FIGS. 4A-4D, the residual portions of the solder mask layer 70a and copper layer 68ca which remain within the die attach location after formation of the cavity 74 form a mounting pedestal 78 supporting the back side 82 of the integrated circuit die 80. The mounting pedestal 78 may be wholly or partially surrounded by the cavity 74. When mounting the integrated circuit die 80 to the die attach location 76, it is preferred that the mounting force be directed towards and generally normal to the upper surface of the pedestal 78.

Figure 5A:
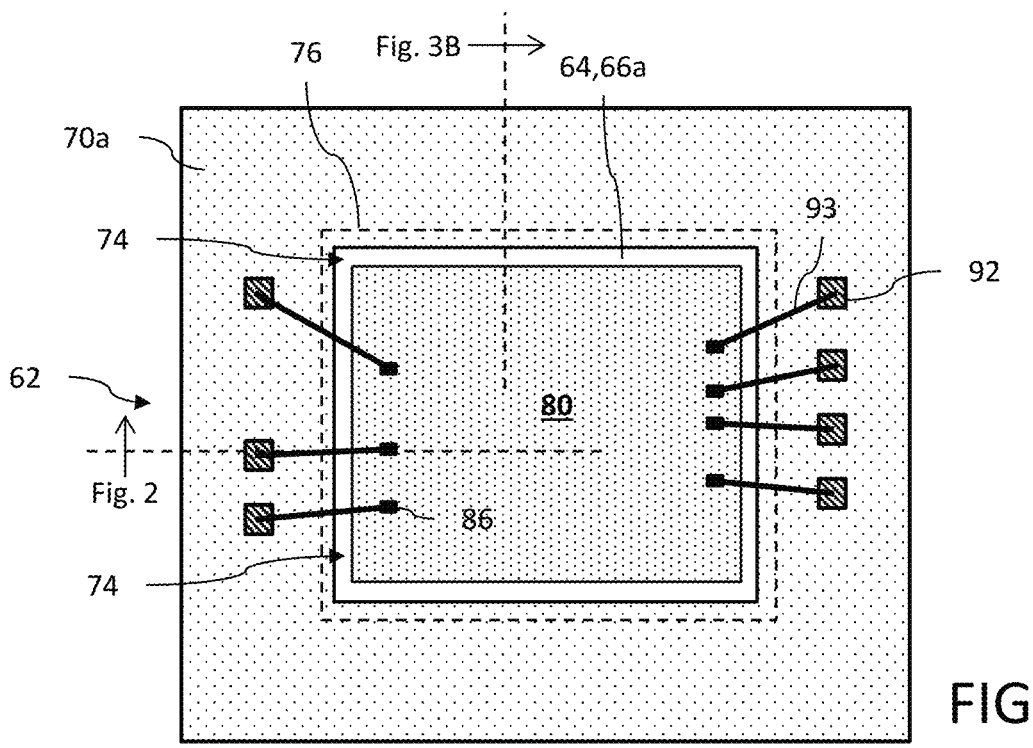
FIGS. 5A-5B are top views showing the relationship of the cavity to the die attach location and mounted integrated circuit die.
Figure 5B:
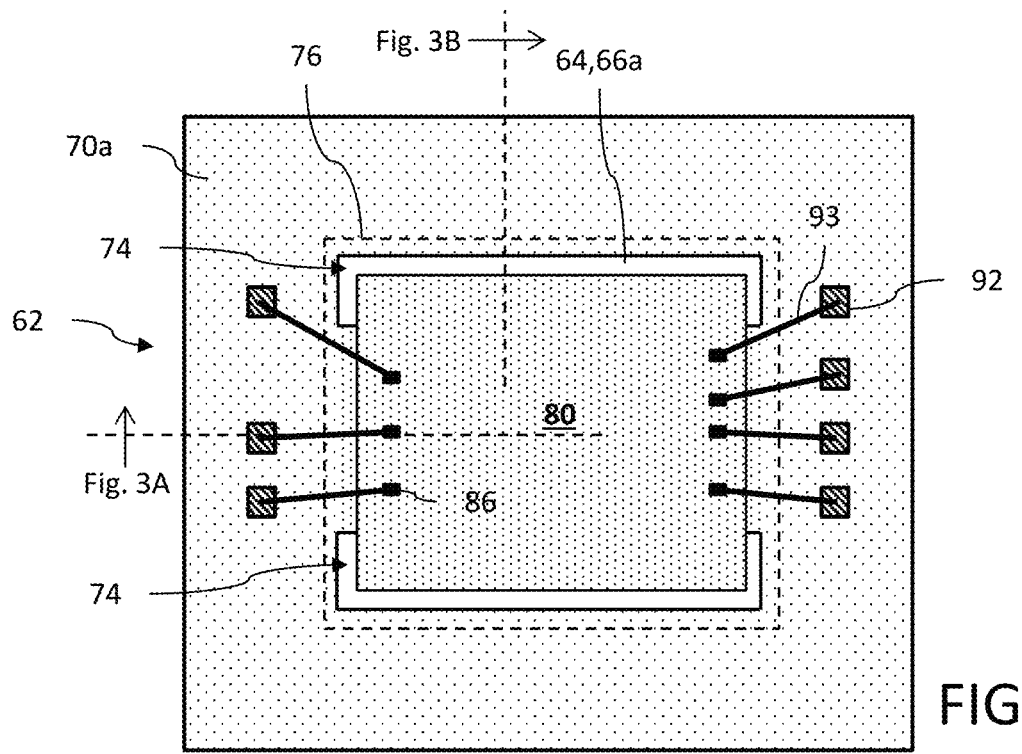

Reference is now made to FIGS. 5A-5B which show top views of the package (minus the cap 100). The top views illustrate the relationship of the cavity 74 to the die attach location 76. The integrated circuit die 80 is mounted to the solder mask layer 70a of the laminated substrate 62 at the die attach location 76. The cavity 74 is formed by removal of the solder mask layer 70a and the copper layer 68c to expose the prepreg layer 66a (in the case of the four copper layer type substrate) or the core 64 (in the case of the two copper layer type substrate). The cavity 74 extends underneath the peripheral area of the integrated circuit die 80, and furthermore extends out beyond an outer peripheral edge of the integrated circuit die 80. FIG. 5A shows an implementation where the cavity 74 is provided under the entire peripheral area of the integrated circuit die 80 (with cross-sections corresponding to FIGS. 2 and 3B, and also FIGS. 4A-4C). FIG. 5B, on the other hand, shows an implementation where the cavity 74 is provided under the peripheral area of the integrated circuit die 80 where there is no corresponding vertically aligned locations of electrical connection pads 86 (with cross-sections corresponding to FIGS. 3A and 3B and also FIG. 4D).

The foregoing description has provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An integrated circuit package, comprising:
   a support substrate formed by an insulating core layer, an electrically conductive layer over the insulating core layer and a solder mask layer over the electrically conductive layer, wherein the support substrate includes a die attach location and first connection pads;
   an integrated circuit chip having a front side with second connection pads and a back side, wherein the back side is mounted to an upper surface of the support substrate at the die attach location;
   wherein the upper surface of the support substrate includes a cavity located within the die attach location, said cavity extending under the back side of the integrated circuit chip, said cavity comprising an area where the solder mask layer and at least a portion of the electrically conductive layer are not present; and
   bonding wires between the first and second connection pads.

2. The integrated circuit package of claim 1, wherein said cavity is present underneath a peripheral portion of the integrated circuit chip where said second connection pads are located.

3. The integrated circuit package of claim 1, wherein said cavity is not present underneath a peripheral portion of the integrated circuit chip where said second connection pads are located.

4. The integrated circuit package of claim 1, wherein said electrically conductive layer outside said cavity has a first thickness and said electrically conductive layer within said cavity has a second thickness less than the first thickness.

5. The integrated circuit package of claim 4, wherein said second thickness is zero.

6. The integrated circuit package of claim 1, wherein said insulating core layer is made of FR4 material.

7. The integrated circuit package of claim 1, wherein said electrically conductive layer is made of copper.

8. The integrated circuit package of claim 1, further comprising an adhesive layer for attaching the back side of the integrated circuit chip to the upper surface of the support substrate.

9. The integrated circuit package of claim 1, wherein said cavity extends beyond said die attach location.

10. The integrated circuit package of claim 1, wherein said cavity extends beyond an outer peripheral edge of the integrated circuit chip.

11. The integrated circuit package of claim 1, further including a cap mounted to the support substrate and configured to enclose said integrated circuit chip.

12. The integrated circuit package of claim 1, wherein residual portions of the solder mask layer and the electrically conductive layer present within the die attach location form a pedestal, wherein the back side of the integrated circuit chip is mounted to the pedestal.

13. The integrated circuit package of claim 12, wherein said cavity completely surrounds the pedestal.

14. The integrated circuit package of claim 12, wherein said cavity partially surrounds the pedestal.

15. A support substrate for an integrated circuit package, comprising:
   an insulating core layer;
   an electrically conductive layer over the insulating core layer;
   a solder mask layer over the electrically conductive layer; and
   at a die attach location for said support substrate, a cavity in the upper surface of the support substrate comprising an area where the solder mask layer and at least a portion of the electrically conductive layer are not present.

16. The support substrate of claim 15, wherein said cavity is not present in the upper surface of the support substrate at the die attach location vertically below connection pads at a front face of an integrated circuit chip to be mounted to the die attach location.

17. The support substrate of claim 15, wherein said electrically conductive layer outside said cavity has a first thickness and said electrically conductive layer within said cavity has a second thickness less than the first thickness.

18. The support substrate of claim 17, wherein said second thickness is zero.

19. The support substrate of claim 15, wherein said insulating core layer is made of FR4 material.

20. The support substrate of claim 15, wherein said electrically conductive layer is made of copper.

21. The support substrate of claim 15, wherein said cavity extends beyond said die attach location.

22. The support substrate of claim 15, wherein residual portions of the solder mask layer and the electrically conductive layer present within the die attach location form a pedestal, wherein the back side of the integrated circuit chip is mounted to the pedestal.

23. The support substrate of claim 22, wherein said cavity completely surrounds the pedestal.

24. The support substrate of claim 22, wherein said cavity partially surrounds the pedestal.

* * * * *